(12) United States Patent
Yedinak et al.

(10) Patent No.: US 12,483,233 B2
(45) Date of Patent: Nov. 25, 2025

(54) METHOD FOR SUPPRESSING VOLTAGE OVERSHOOTS

(71) Applicant: SEMICONDUCTOR COMPONENTS INDUSTRIES, LLC, Scottsdale, AZ (US)

(72) Inventors: Joseph Andrew Yedinak, Mountain Top, PA (US); Gary Horst Loechelt, Tempe, AZ (US); Xiaoli Wu, Shanghai (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 50 days.

(21) Appl. No.: 18/396,852

(22) Filed: Dec. 27, 2023

(65) Prior Publication Data
US 2025/0219632 A1 Jul. 3, 2025

(51) Int. Cl.
| | |
|---|---|
| *H03K 17/081* | (2006.01) |
| *H03K 17/687* | (2006.01) |
| *H10D 62/10* | (2025.01) |
| *H10D 62/832* | (2025.01) |
| *H10D 84/85* | (2025.01) |
| *H10D 89/60* | (2025.01) |

(52) U.S. Cl.
CPC ..... *H03K 17/08104* (2013.01); *H03K 17/687* (2013.01); *H10D 62/127* (2025.01); *H10D 62/8325* (2025.01); *H10D 84/85* (2025.01); *H10D 89/813* (2025.01)

(58) Field of Classification Search
CPC .......... H03K 17/08104; H03K 17/687
USPC ............................................. 327/427
See application file for complete search history.

(56) References Cited

U.S. PATENT DOCUMENTS

| | | |
|---|---|---|
| 2004/0135201 A1 | 7/2004 | Elbanhawy |
| 2008/0017920 A1 | 1/2008 | Sapp et al. |
| 2009/0033289 A1 | 2/2009 | Xing et al. |
| 2012/0057387 A1 | 3/2012 | Lai et al. |
| 2012/0126767 A1 | 5/2012 | Luo et al. |
| 2012/0273871 A1 | 11/2012 | Yedinak et al. |
| 2013/0257177 A1 | 10/2013 | Jacobson et al. |
| 2014/0001856 A1 | 1/2014 | Agamy et al. |
| 2014/0252494 A1 | 9/2014 | Lui et al. |

(Continued)

FOREIGN PATENT DOCUMENTS

| | | |
|---|---|---|
| DE | 102012025769 B3 | 7/2016 |
| EP | 4290773 A1 | 12/2023 |

OTHER PUBLICATIONS

Extended European Search Report for European Application No. 24169139.3, mailed Oct. 16, 2024, 10 pages.

(Continued)

*Primary Examiner* — Tomi Skibinski
(74) *Attorney, Agent, or Firm* — Brake Hughes Bellermann LLP

(57) ABSTRACT

Devices and methods are disclosed for facilitating faster switching of silicon-based and silicon carbide-based power transistors suitable for use in electric vehicles. The disclosed techniques can minimize the impact on turn-on and turn-off losses, while reducing gate voltage and drain voltage spikes during device switching. A fast/slow cell design incorporating shielded gate MOSFETs controls gate-to-drain capacitance and gate resistances to optimize suppression of voltage overshoot.

20 Claims, 12 Drawing Sheets

(56) References Cited

U.S. PATENT DOCUMENTS

| | | |
|---|---|---|
| 2015/0206983 A1 | 7/2015 | Felsl et al. |
| 2016/0344383 A1 | 11/2016 | Su et al. |
| 2019/0074374 A1 | 3/2019 | Loechelt |
| 2020/0251588 A1 | 8/2020 | Loechelt et al. |
| 2021/0083660 A1* | 3/2021 | Havanur .................. H10D 8/25 |
| 2023/0223933 A1* | 7/2023 | Schugart .............. H03K 17/163 327/109 |

OTHER PUBLICATIONS

Yamashita, Hiroaki, et al., "Low noise superjunction MOSFET with integrated snubber structure." 2018 IEEE 30th International Symposium on Power Semiconductor Devices and ICs (ISPSD), IEEE, 2018, 4 pages.

Saito, Wataru, "Breakthrough of drain current capability and on-resistance limits by gate-connected superjunction MOSFET." 2018 IEEE 30th International Symposium on Power Semiconductor Devices and ICs (ISPSD). IEEE, 2018, 4 pages.

* cited by examiner

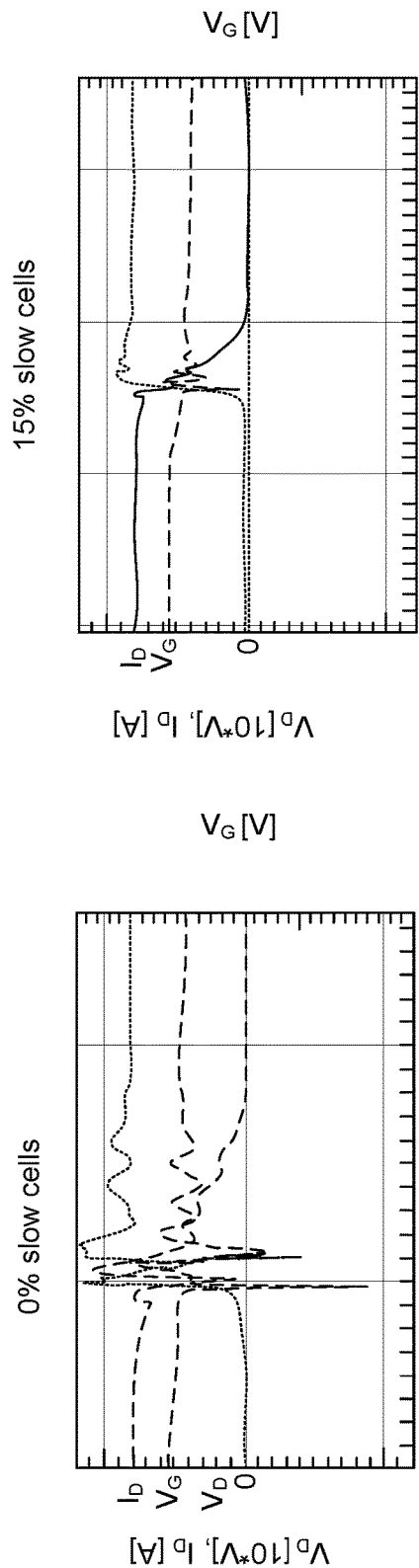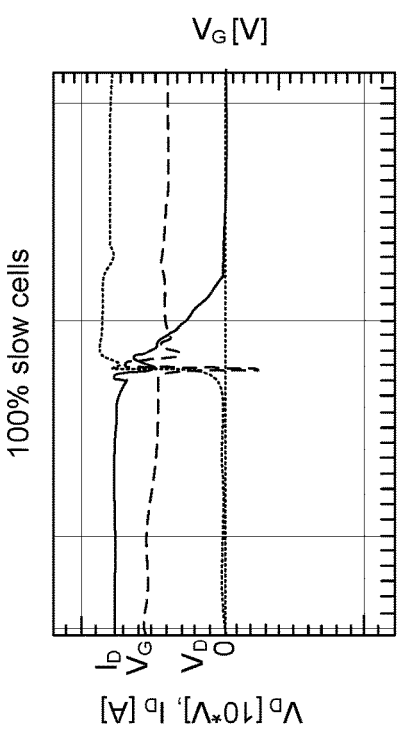
FIG. 12A
FIG. 12B
FIG. 12C

METHOD FOR SUPPRESSING VOLTAGE OVERSHOOTS

TECHNICAL FIELD

This description relates to high power integrated circuit modules. More specifically, this description relates to suppression of voltage spikes in a high power integrated circuit module.

BACKGROUND

Semiconductor device assemblies, e.g., chip assemblies, that include high power semiconductor devices can be used in various applications, including electric vehicles (EVs), hybrid electric vehicles (HEVs), and industrial applications. High power modules may operate for example, at voltages exceeding 100 V, and may carry large currents, e.g., 200 A, as opposed to, for example, computer applications that operate at voltages in the range of about 1 V to about 15 V. Power transistors can include, for example, insulated-gate bipolar transistors (IGBTs), shielded gate metal oxide semiconductor field effect transistors (shielded gate MOSFETs), and double-diffused metal oxide semiconductor (DMOS) devices. Some shielded gate MOSFETs can be formed in a silicon carbide (SiC) substrate.

SUMMARY

In some aspects, the techniques described herein relate to an apparatus, including: a first four-terminal device having a first source, a first gate, a first drain, and a first shield; a second four-terminal device having a second source, a second gate, a second drain, and a second shield, wherein: the first drain is coupled to the second drain; the first gate is coupled to the second gate; and the first shield and the first source are coupled to the second source; and a gate resistor coupled between the first gate and the second gate, the gate resistor configured to reduce voltage overshoot during a switching event.

In some aspects, the techniques described herein relate to a circuit, including: a plurality of first cells, each first cell including a first transistor having a first source, a first gate, and a first drain, the first transistor further configured with a first shield terminal coupled to the first source; and a plurality of second cells, each second cell including a second transistor having a second source, a second gate, and a second drain, the second transistor further configured with a second shield terminal.

In some aspects, the techniques described herein relate to a method, including: forming a plurality of first transistors and a plurality of second transistors in a die; configuring the plurality of first transistors to have lower power loss than the plurality of second transistors; and configuring the plurality of second transistors to have a greater RC time constant than the plurality of first transistors.

BRIEF DESCRIPTION OF THE DRAWINGS

FIGS. 12A, 12B, and 12C are plots showing the simulated behavior of switching cells during a turn-on event for three different area ratios, according to implementations of the present disclosure.

Figure 1:
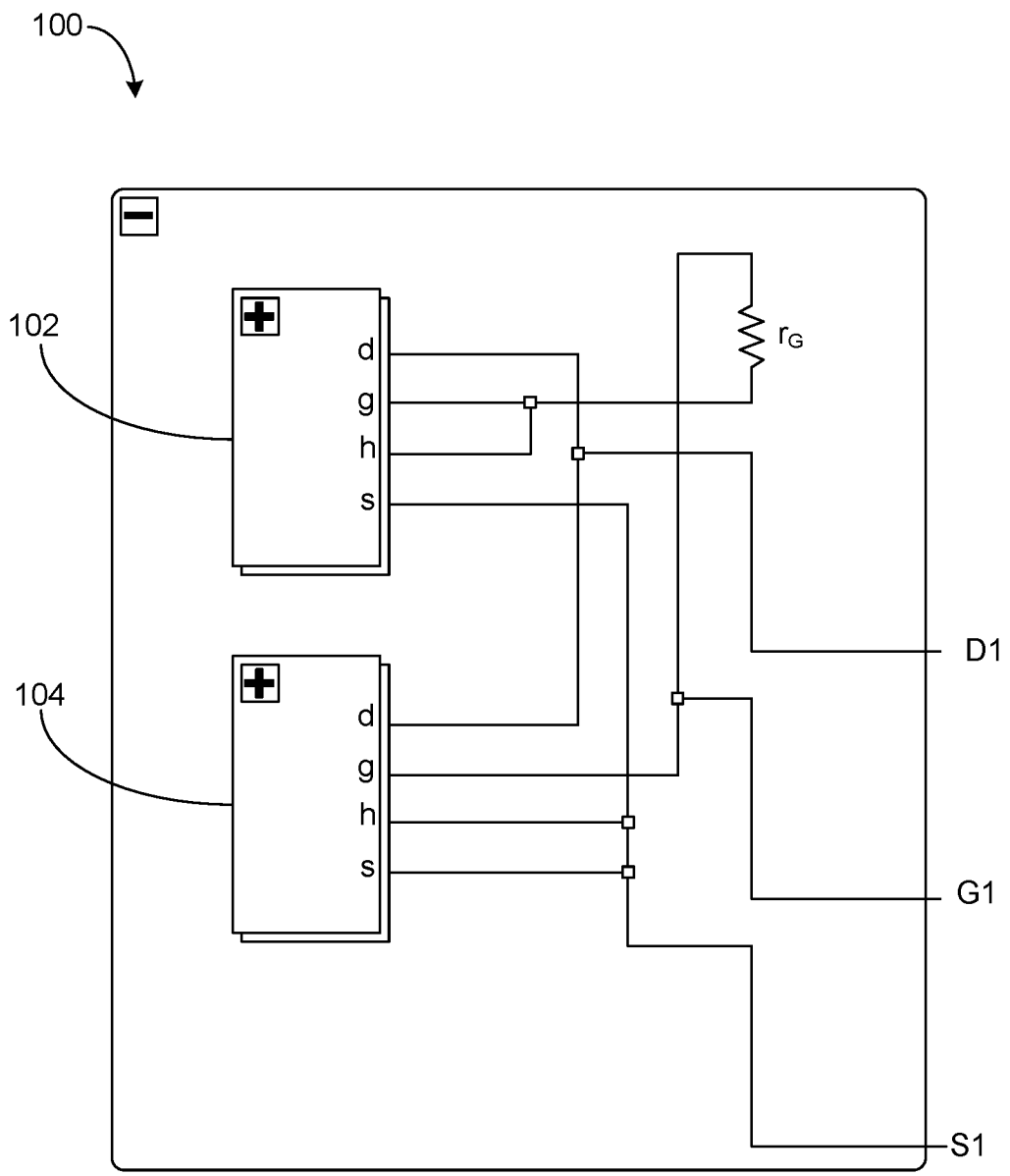
FIG. 1 is a circuit schematic diagram of a cell that includes a fast switching device and a slow switching device, according to a first implementation of the present disclosure.

Aspects of the present disclosure are best understood from the following detailed description when read with the accompanying figures. It is noted that, in accordance with common practice in the industry, various features are not necessarily drawn to scale. Dimensions of the various features may be arbitrarily increased or reduced for clarity of discussion. In the drawings, like reference symbols may indicate like and/or similar components (elements, structures, etc.) in different views. The drawings illustrate generally, by way of example, but not by way of limitation, various implementations discussed in the present disclosure. Reference symbols shown in one drawing may not be repeated for the same, and/or similar elements in related views. Reference symbols that are repeated in multiple drawings may not be specifically discussed with respect to each of those drawings but are provided for context between related views. Also, not all like elements in the drawings are specifically referenced with a reference symbol when multiple instances of an element are illustrated.

DETAILED DESCRIPTION

When power to a shielded gate MOSFET switches between an on state (low voltage, high current) and an off state (high voltage, low current), there can be a brief time interval during the transition when both high voltage and high current exist simultaneously. This situation results in power loss associated with the high voltage according to P=V²/R, as well as power loss associated with the high current according to P=I²R. Faster switching incurs less power loss. However, voltage spikes may also occur during power switching, overshooting the rated voltage of the device. Voltage spikes can be caused, for example, by parasitic inductors. A voltage overshoot event appears as a voltage spike followed by ringing, e.g., voltage oscillations, or fluctuations, that decrease in amplitude over a short period of time. Faster switching can exacerbate the voltage spike, causing a higher amplitude, which may also take longer to decay.

Voltage overshoot can be suppressed by introducing a resistor-capacitor (RC) snubber to slow down the switching, and thereby reduce the initial voltage spike. But slower switching increases power loss and decreases efficiency. Another problem with this approach is that snubbers can be designed as external components applied to the overall die, which further increases component cost and power loss within the high power module as a whole.

This disclosure presents a new method to address voltage overshoot while minimizing power loss, without resorting to the use of RC snubbers or snubber capacitors that reduce switching speeds of various high power semiconductor devices. In some implementations, suppressing or preventing voltage overshoot is imperative, whereas minimizing power loss, while desirable, may be of relatively less concern. With the new method described herein, voltage overshoot can be suppressed without slowing down an entire high power switching operation. Instead, a dedicated portion of a high power module can be slowed down by various other means, to suppress voltage overshoot. Meanwhile, other portions of the high power module can remain configured for fast switching. The techniques described below can be applied to any type of power switches such as, for example, silicon based MOSFETs, IGBTs, and SiC MOSFETs, as well as shielded gate MOSFETs.

FIG. 1 shows a first implementation of a cell 100 for use in preventing voltage overshoot, in accordance with some implementations of the present disclosure. The cell 100 can have a high gate RC time constant that slows the switching speed of the cell 100. Externally, the cell 100 appears to be a single three-terminal device having an external source terminal S1, an external drain terminal D1, and an external gate terminal G1. Internally, the cell 100 includes a slow transistor 102 coupled in parallel with a fast transistor 104. The fast transistor 104 can be implemented as any fast switching device, while the slow transistor 102 can be implemented as any slow switching device. In some implementations, components (e.g., transistor, resistors) of the cell 100 can be discrete devices. In some implementations, such components of the cell 100 can be integrated circuit devices or a monolithic implementation.

In some examples, both the slow transistor 102 and the fast transistor 104 can be implemented using shielded gate MOSFETs. Each shielded gate MOSFET in the cell 100 is a four-terminal device that includes a source terminal s, a drain terminal d, a gate terminal g, and a shield terminal h. In the cell 100, corresponding source terminals of the slow transistor 102 and the fast transistor 104 are coupled together at a common source connection S1, and corresponding drain terminals are coupled together at a common drain connection D1. Further, in the cell 100, the shield terminal h of the slow transistor 102 is coupled to the gate terminal g and the shield terminal h of the fast transistor 104 is coupled to the source terminal s. A gate resistance $r_G$ can optionally be coupled between corresponding gate terminals of the slow transistor 102 and the fast transistor 104, which are coupled together at a common gate connection G1. The shield-to-gate connection increases the gate-to-drain capacitance. The shield-to-gate connection and the addition of the gate resistance $r_G$ both contribute to slowing down the speed of the cell 100 by increasing the gate RC time constant. In some implementations, $r_G$ can be set to 10 Ohms, e.g., within a range of about 4 Ohms to about 20 Ohms. In some implementations, IG can be omitted. By varying the value of $r_G$ from one cell to another within a die, different cells 100 can have different gate RC time constants, so that some of the cells 100 are fast cells and others are slow cells.

Figure 2:
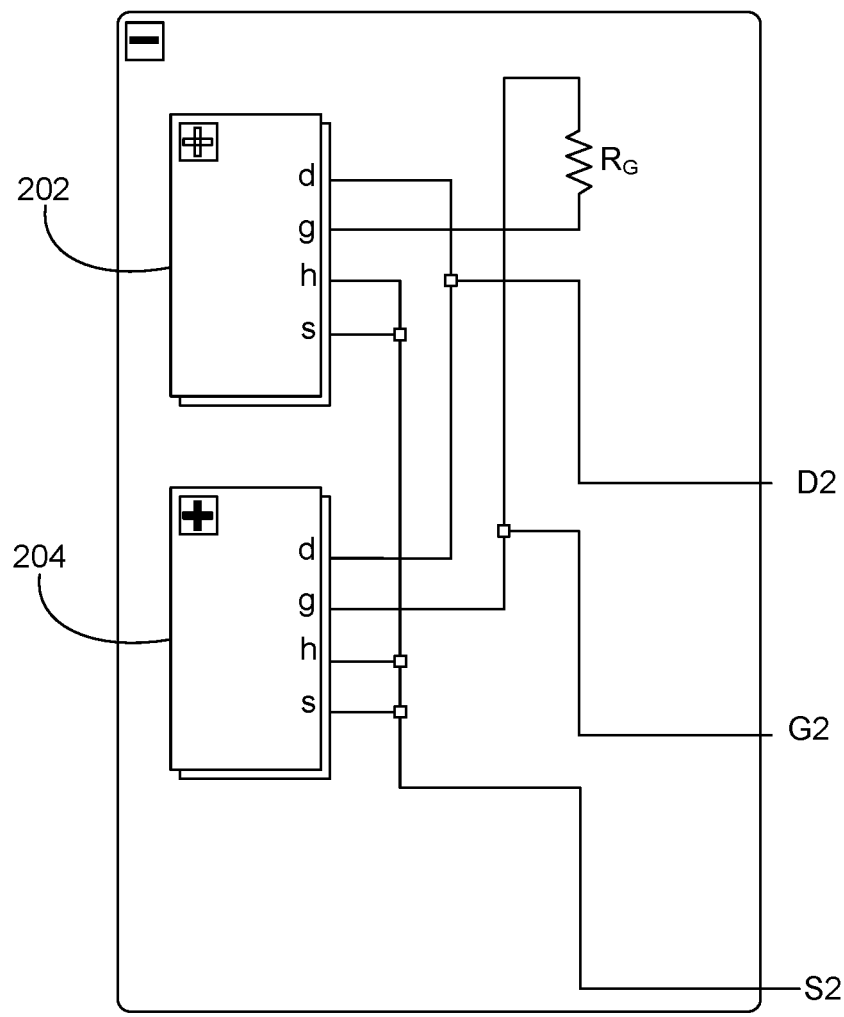
FIG. 2 is a circuit schematic diagram of a cell that includes a fast switching device and a slow switching device, according to a second implementation of the present disclosure.

FIG. 2 shows a second implementation of a cell 200 for use in preventing voltage overshoot, in accordance with some implementations of the present disclosure. The cell 200 is similar to the cell 100 in certain respects, but it will become apparent that internal connections differ between the two types of cells. Like the cell 100, the cell 200 can have a high gate RC time constant that slows the switching speed of the cell 200. Externally, the cell 200 appears to be a three-terminal device having an external source terminal S2, an external drain terminal D2, and an external gate terminal G2. Internally, the cell 200 includes a slow transistor 202 coupled in parallel with a fast transistor 204. The fast transistor 204 can be implemented as any fast switching device, while the slow transistor 202 can be implemented as any slow switching device. In some implementations, components (e.g., transistors, resistor(s)) of the cell 200 can be discrete devices. In some implementations, such components of the cell 200 can be integrated circuit devices.

In some examples, both the slow transistor 202 and the fast transistor 204 can be implemented using shielded gate MOSFETs. Each shielded gate MOSFET in the cell 200 is a four-terminal device that includes a source terminal s, a drain terminal d, a gate terminal g, and a shield terminal h. In the cell 200, corresponding source terminals of the slow transistor 202 and the fast transistor 204 are coupled together at the external source terminal S2, and corresponding drain terminals are coupled together at the external drain terminal D2. Further, in the cell 200, the shield terminals of the slow transistor 202 and the fast transistor 204 are coupled to respective source terminals s. The shield-to-source connection differentiates the cell 200 from the cell 100, which features a shield-to-gate connection. A gate resistance $R_G$ can be coupled between the gate terminal g of the slow transistor 202 and the gate terminal g of the fast transistor 204, which are coupled together at the external gate terminal G2. The addition of the gate resistance $R_G$ contributes to slowing down the speed of the cell 200. The value of the gate resistance is another difference between the cell 200 and the cell 100. In some implementations, $R_G$ in the cell 200 can be set to about 160 Ohms, e.g., within a range of about 50 Ohms to about 400 Ohms, so that $R_G > r_G$.

In other examples, the slow transistor 202 and the fast transistor 204 may not be implemented as shielded gate MOSFETs. Instead, the slow transistor 202 and the fast transistor 204 can be either planar or simple trench MOSFETs formed on either silicon or SiC substrates. When a planar or simple trench MOSFET is used, the configuration shown in FIG. 2 is modified by omitting the shield terminal h. In this configuration, the distinction between slow and fast transistors can be determined by the addition of the gate resistance $R_G$.

Thus, a fast/slow cell design such as the cell 100 or the cell 200 can reduce gate voltage spikes and drain voltage spikes by adjusting gate-to-drain capacitances ($C_{gd}$), gate resistance ($R_g$), or both. By adjusting the gate RC time constant in this way, the cell 100 and/or the cell 200 can be configured as either a fast cell or a slow cell, and replicated on a die. In some implementations, the cells 200 can be faster than the cells 100, due to the difference in shield connections. However, depending on the values of $R_G$ and $r_G$, in some implementations, the cells 100 can be faster than the cells 200. In some implementations, $R_G$ and $r_G$ can be set differently for different groups of cells, so that a statistical speed distribution of the cells 100 overlaps with a statistical speed distribution of the cells 200. This multi-cell design introduces flexibility within the die, and thus avoids applying a correction to an entire die that might otherwise be limited to a single cell design.

In some implementations, a majority of cells in the semiconductor die can be fast cells that are optimized for fast switching and minimum power loss, while a minority of cells in the semiconductor die are slow cells that have a high gate RC time constant or a high gate drive resistance. Additionally, or as an alternative to varying the gate resistance between fast and slow cells, the fast cells can be coupled to a separate gate bus from that of the slow cells. The gate bus can be connected to a single input control signal to introduce a dedicated gate resistance to control the switching speed, thereby separating the speed of the fast cells from the speed of the slow cells.

In one example, a silicon MOSFET that is coupled in series with a silicon carbide JFET as part of a cascode circuit, can exhibit a drain voltage overshoot. Instead of adding an RC snubber to the cascode circuit, the silicon MOSFET can be implemented as a pair of fast and slow shielded gate MOSFETs coupled in parallel, with a shield-to-gate connection on the slow device to increase the gate-to-drain capacitance, as in the cell 100. A gate resistance can be introduced to further increase the gate RC time constant. Alternatively, the pair of shielded gate MOSFETs can both have shield-to-source connections as in the cell 200, with a higher gate resistance $R_G$ than the gate resistance $r_G$ in the cell 100 implementation.

Figure 3:
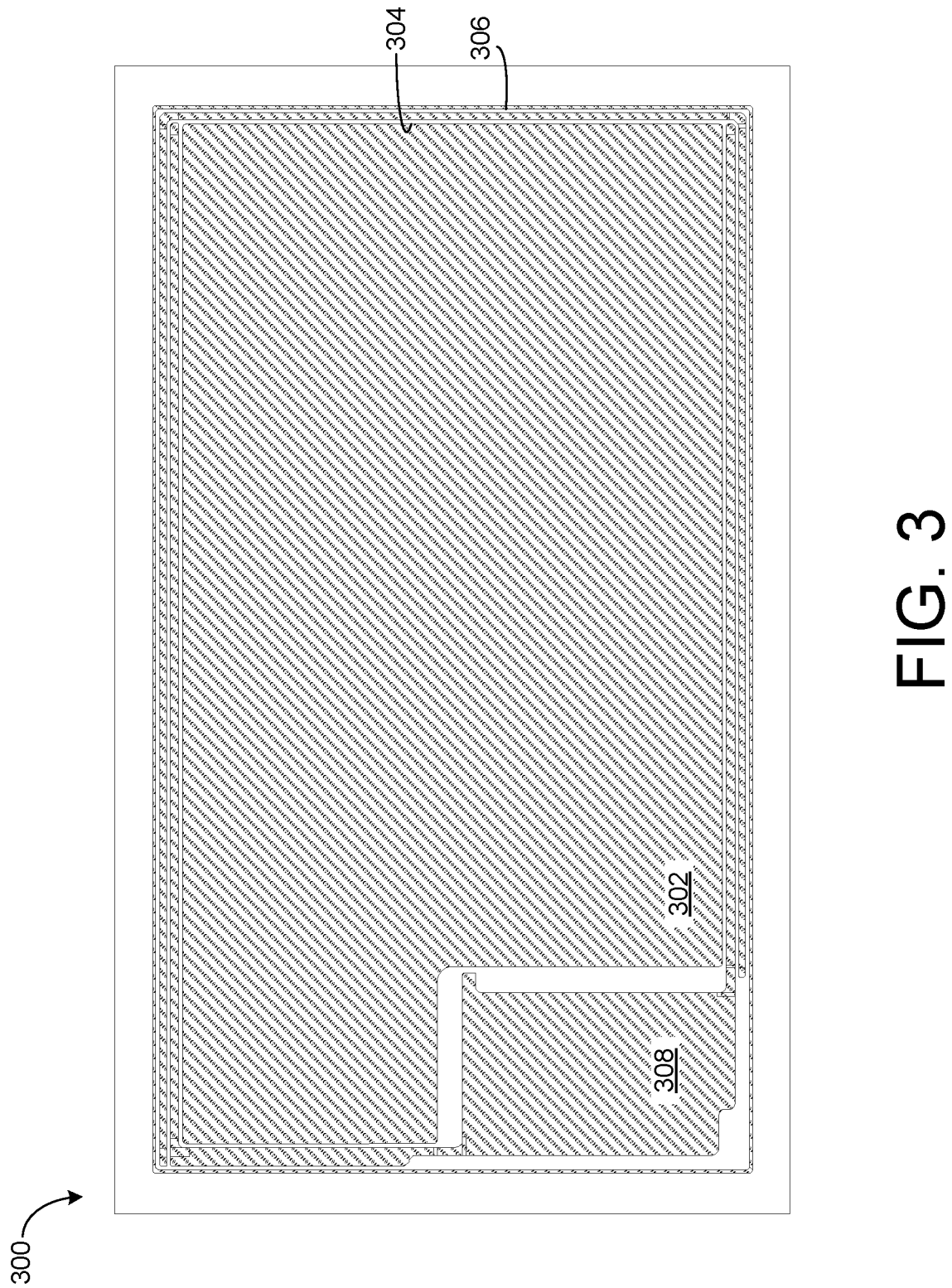
FIG. 3 is a top plan view of a die showing connections to an active area, according to implementations of the present disclosure.

FIG. 3 shows a layout of a die 300, in accordance with some implementations of the present disclosure. The die 300 includes metal lines that provide connections to, for example, the cells 100 or the cells 200. The metal lines surround an active area 302 in which transistors are formed. In some implementations, the die 300 encompasses an active area 302 of about 1.5 to 5.0 square millimeters. In some implementations, the metal lines include two gate metal feeds—an inner "fast" gate metal feed 304 and an outer "slow" gate metal feed 306. The fast gate metal feed 304 and the slow gate metal feed 306 can couple portions of the active area 302 to a gate pad 308 shown in the lower left corner of the die 300. In some implementations, a resistor block disposed beneath or adjacent to the gate pad 308 includes an array of shield trenches outside the active area 302. In some implementations, the inner fast gate metal feed 304 is directly connected to the gate pad 308 and connects to active cells e.g., cells 200, in which the shield terminal h is coupled to the source terminal s. In some implementations, the outer slow gate metal feed 306 is connected to the gate pad 308 through the resistor block and connects to active cells, e.g., cells 100, in which the shield terminal h is coupled to the gate terminal g.

Figure 4:
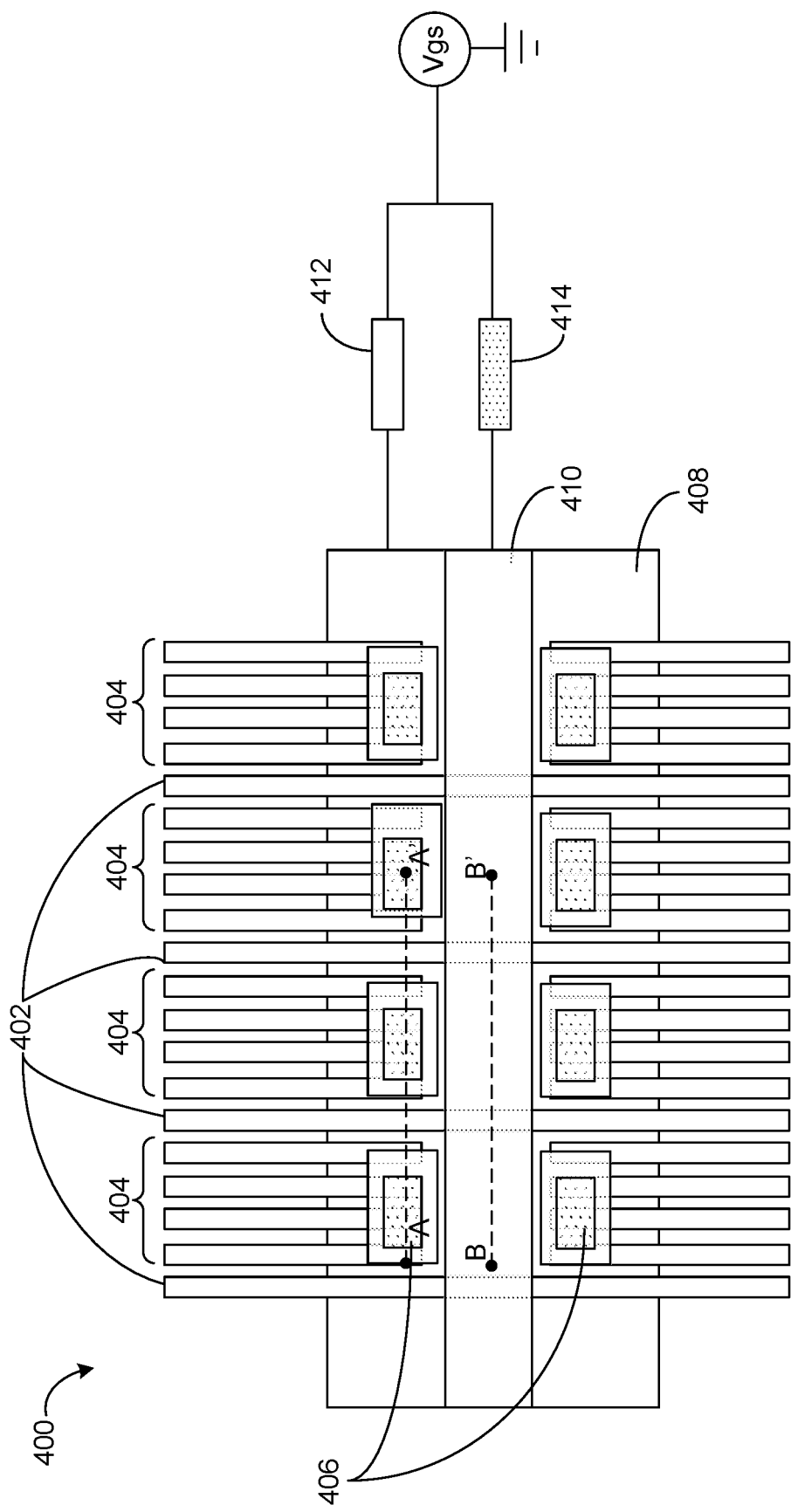
FIG. 4 is a top plan view of fast cells and slow cells within the active area shown in FIG. 3, according to implementations of the present disclosure.

FIG. 4 shows a top plan view of a layout of an active cell region 400, in accordance with some implementations of the present disclosure. The active cell region 400 can be located in the active area 302. In one example, the size of the active cell region 400 is in a range of about 20 mm² to about 30 mm². In some implementations, the active cell region 400 includes slow cells distributed among fast cells. The slow cells can be identified by slow cell gate structures 402 (four shown), disposed between groups of fast cells, identified by fast cell gate structures 404 (eight groups shown). The slow cell gate structures 402 can extend across the entire active cell region 400, whereas the fast cell gate structures 404 can be shorter, extending across less than half the active cell region 400. In the example shown, each group of four fast cell gate structures 404 is coupled to a gate contact 406 (eight shown). A metal gate bus 408 can be formed over, and can be coupled to, each of the gate contacts 406. A polysilicon gate bus 410 can be directly coupled to each of the slow cell gate structures 402. Materials used to fabricate the metal gate bus 408 and the polysilicon gate bus 410 can further control the speed of the devices coupled to the bus. For example, the polysilicon gate bus 410 may provide higher resistance connectivity for the slow cells, than the metal gate bus 408 which is coupled to the fast cells. To further control the speed of the cells, a fast cell gate resistor 412 can be coupled to the fast cell gate structures 404 via the metal gate bus 408; and a slow cell gate resistor 414 can be coupled to the slow cell gate structures 402 via the polysilicon gate bus 410.

Figure 5:
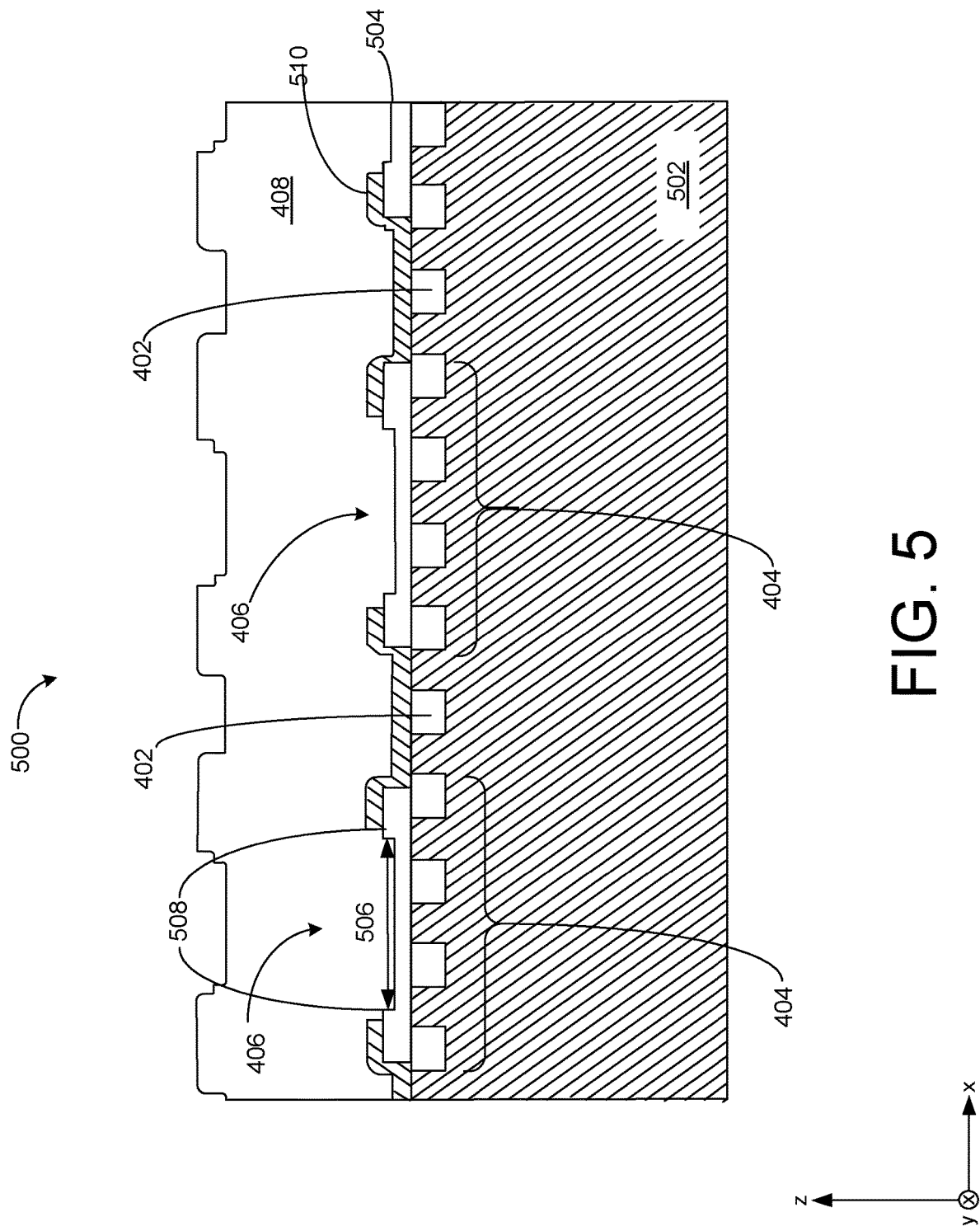
FIG. 5 is a cross-sectional view along a cut line A-A' of the active area shown in FIG. 4, according to implementations of the present disclosure.

FIG. 5 shows a cross-sectional view 500 of the active cell region 400, along a cut line A-A' shown in FIG. 4, in accordance with some implementations of the present disclosure. In this example, the cut line A-A' intersects about 2-½ groups of fast cells and two slow cells. FIG. 5 shows that the active cell region 400 is constructed on a substrate 502, e.g., a silicon substrate or other semiconductor substrate, e.g., a silicon carbide (SiC) substrate. In some implementations, non-semiconductor substrate materials can be used, for example, sapphire, glass, polymer, and so on. Transistor source and drain regions are formed in the substrate 502 but are not shown here, so as to focus on the gate structures. The slow cell gate structures 402 and fast cell gate structures 404 can be formed together in the substrate 502 by forming trenches, e.g., by etching, and then lining the trenches with an insulator, e.g., oxide, and filling the trenches with a conductive material, e.g., polysilicon or metal. In some implementations, the trenches can be equally spaced and sized. Next, a polysilicon surface layer 504 can be formed over the filled trenches and patterned so as to contact only the fast cell gate structures 404 and not the slow cell gate structures 402. The polysilicon surface layer 504 thus forms gate contacts 406. In some implementations, central portions 506 of the polysilicon surface layer 504 can be recessed relative to end portions 508. Next, a thin inter-layer dielectric (ILD) 510 can be grown conformal to the polysilicon surface layer 504. Openings can then be formed in the ILD 510 while the remaining ILD 510 covers the end portions 508 of the polysilicon surface layer 504 as well as the slow cell gate structures 402. Finally, a gate metal layer forming the metal gate bus 408 can be conformally deposited over the gate contacts 406 to the fast cell gate structures 404. The recessed pattern of the polysilicon surface layer 504 replicated in the upper surface of the metal gate bus 408 can be removed in a subsequent planarization operation.

Figure 6:
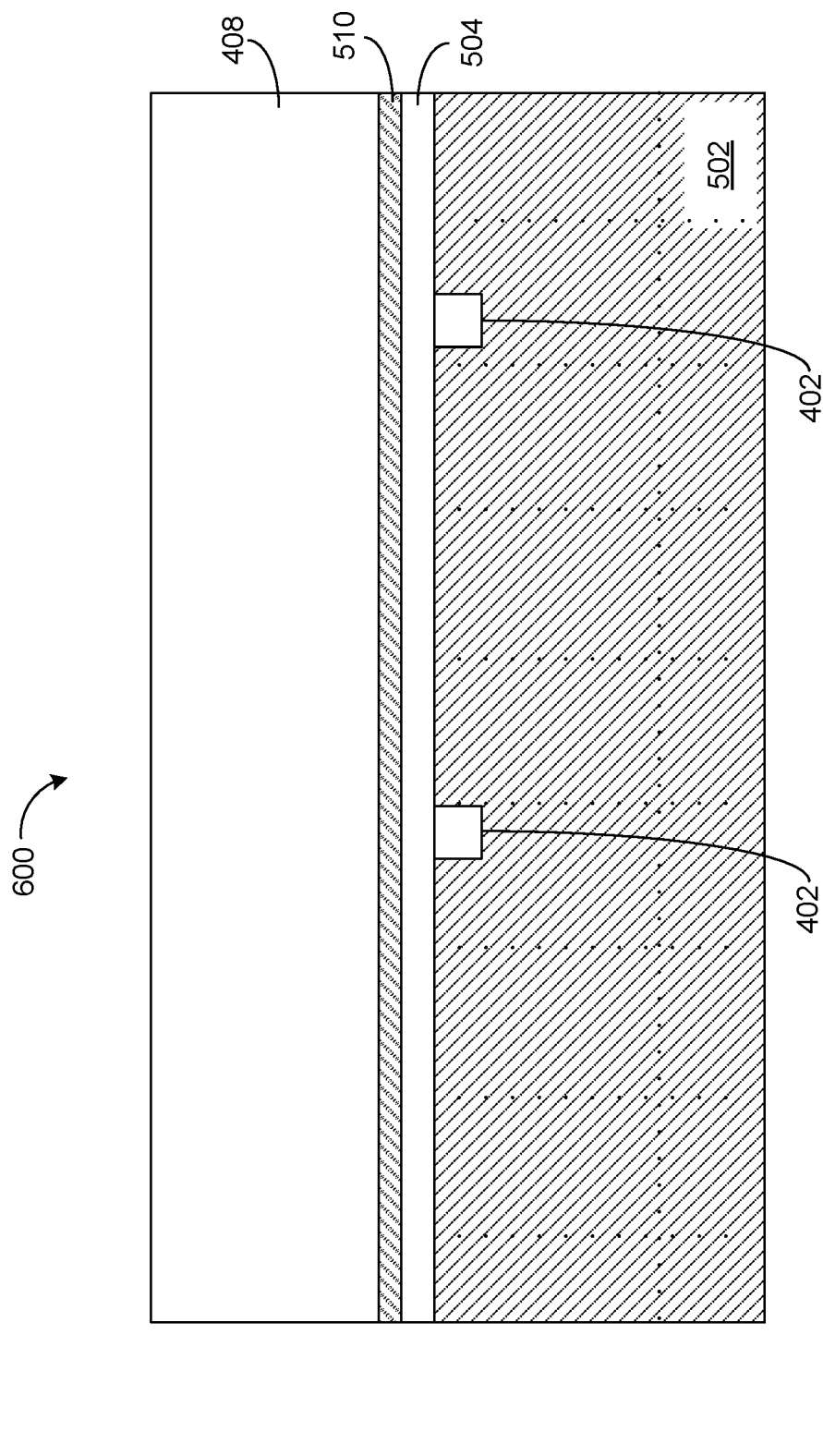
FIG. 6 is a cross-sectional view along a cut line B-B' of the active area shown in FIG. 4, according to implementations of the present disclosure.

FIG. 6 shows a cross-sectional view 600 of the active cell region 400, along a cut line B-B' shown in FIG. 4, in accordance with some implementations of the present disclosure. The cut line B-B' intersects two of the slow cell gate structures 402. Because the cut line B-B' is located in a region between the rows of gate contacts 406, the cut line B-B' does not intersect any of the fast cell gate structures 404. Consequently, the cross-sectional view 600 shows the substrate 502, and two filled trenches formed in the substrate 502, which are the slow cell gate structures 402. A blanket polysilicon surface layer 504, a blanket layer of ILD 510, and the metal gate bus 408 are formed over the slow cell gate structures 402.

Figure 7:
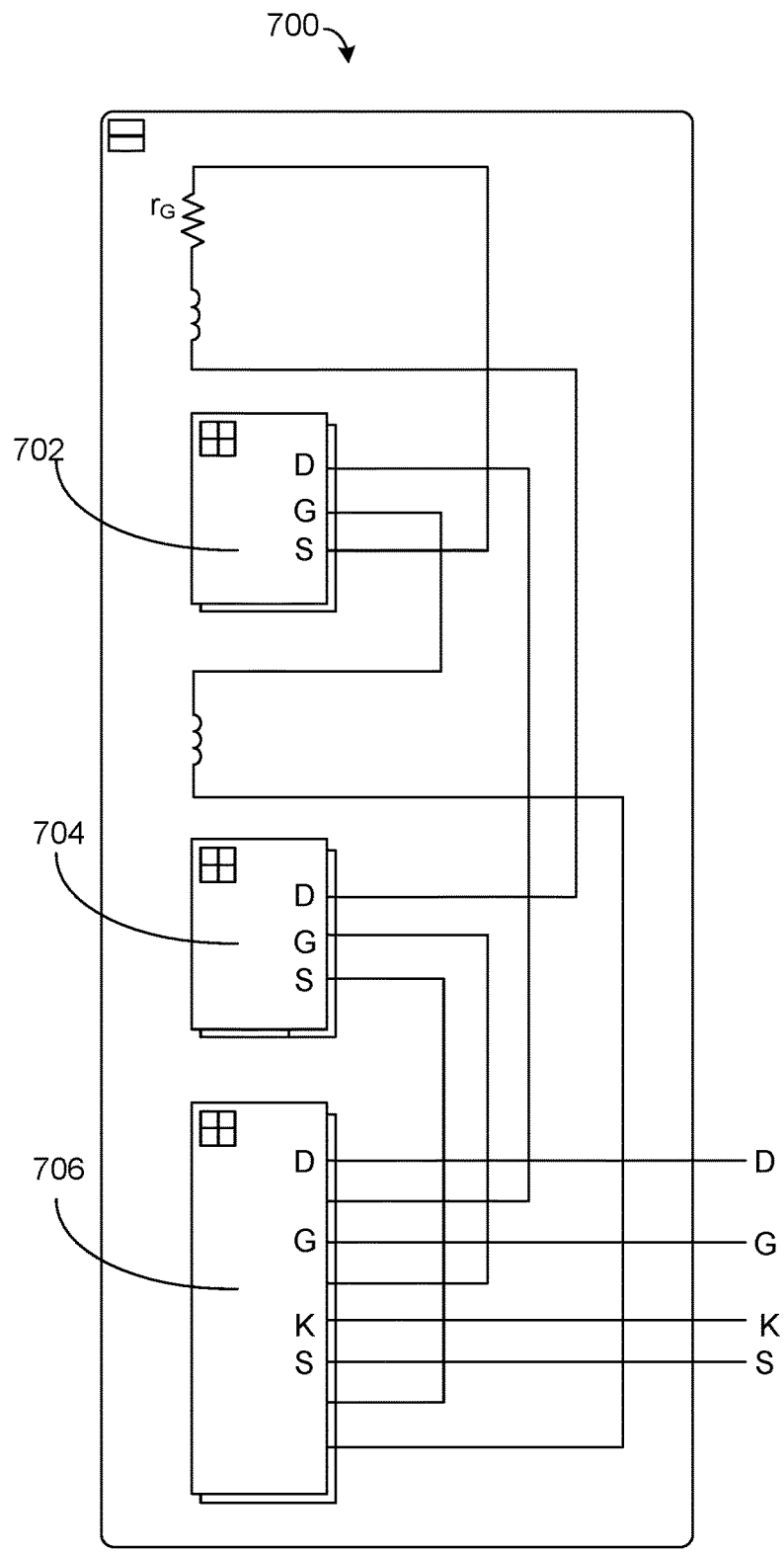
FIG. 7 is a circuit schematic diagram of a cell that includes a fast switching device and a slow switching device, according to a second implementation of the present disclosure.

FIG. 7 shows a schematic diagram of a cascode circuit 700 for use in preventing voltage overshoot, in accordance with some implementations of the present disclosure. In some implementations, the cascode circuit 700 can be implemented as a JFET-based cascode circuit. As shown in FIG. 7, the cascode circuit 700 can include a high voltage JFET chip 702 formed on a SiC substrate and a low voltage MOSFET chip 704 formed on a silicon substrate. The high voltage JFET chip 702 and the low voltage MOSFET chip 704 are three-terminal devices that each include a source terminal s, a drain terminal d and a gate terminal g. The cascode circuit 700 can further include a package subcircuit chip 706. In some implementations, the package subcircuit chip 706 includes a source terminal s, a drain terminal d, a gate terminal g, and a Kelvin return terminal k for the gate, which serve as external terminals of the cascode circuit 700. The package subcircuit chip 706 can further include internal components, e.g., parasitic passive components such as resistors, inductors, and capacitors. Additional resistors and inductors coupled between the various chips are explicitly shown in FIG. 7. In some implementations, components (e.g., transistors, resistor(s)) of the cascode circuit 700 can be discrete devices. In some implementations, such components of the cascode circuit 700 can be integrated circuit devices.

Figure 8A:
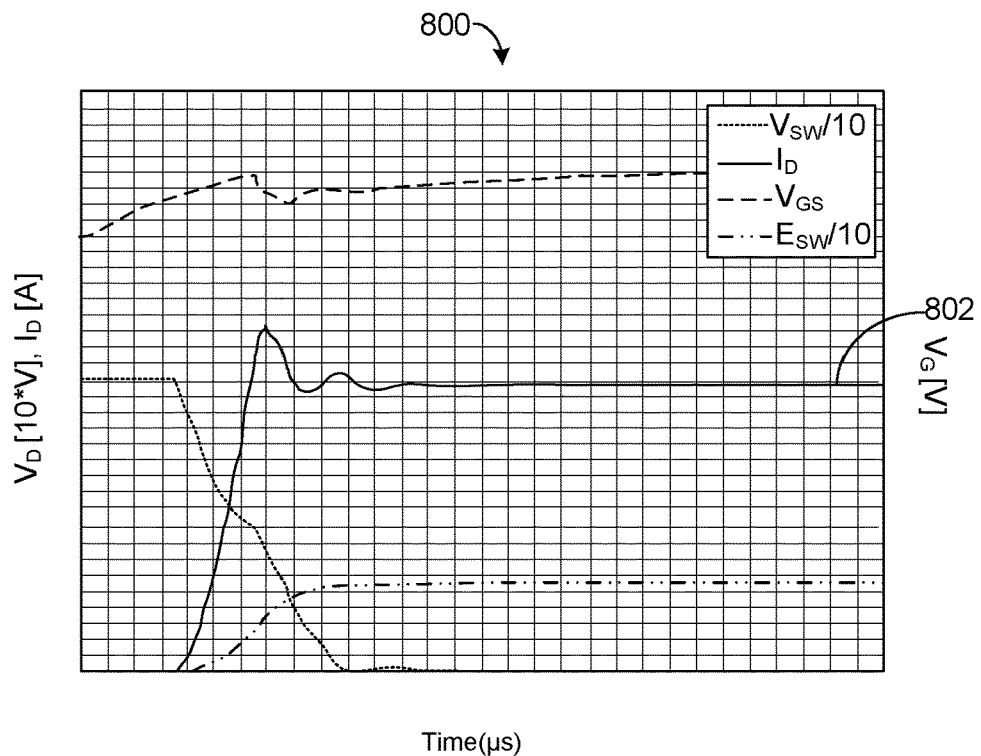
FIG. 8A is a plot showing the simulated behavior of a first switching cell during a turn-on event, according to implementations of the present disclosure.
Figure 8B:
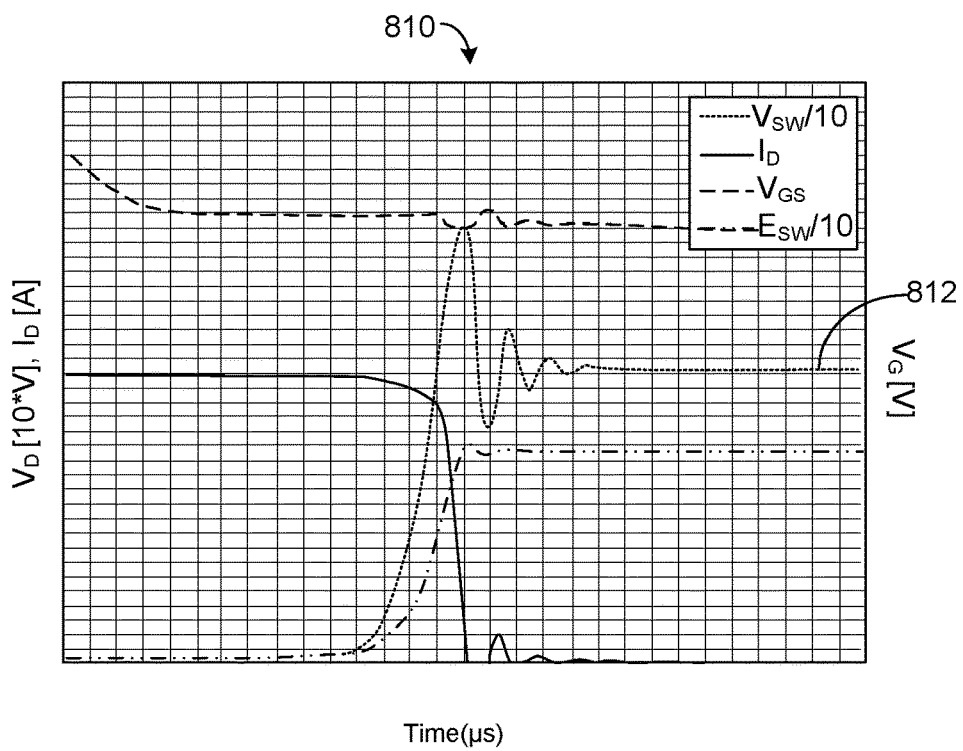
FIG. 8B is a plot showing the simulated behavior of the first switching cell during a turn-off event, according to implementations of the present disclosure.

FIGS. 8A and 8B show simulation results of the cascode circuit described above with reference to FIG. 7 and FIG. 1, in accordance with some implementations of the present disclosure. In FIGS. 8A and 8B, the low voltage MOSFET chip 704 of the high power cascode circuit 700 is implemented with the cell 100. That is, the low voltage MOSFET chip 704 includes the fast transistor 104 and the slow transistor 102 in parallel, wherein the fast device dominates turn-on, and the slow device dominates turn-off. FIG. 8A shows a plot 800 of voltages and currents as a function of time during turn-on for In the simulation, the drain current $I_D$ was set to 50 A. During the switching on event, as the switching voltage $V_{SW}$ decreases, the drain current $I_D$ abruptly turns on and experiences current overshoot 802. FIG. 8A indicates that the cell 100 will effectively damp the overshoot 802 within about 0.025 μs.

FIG. 8B shows a plot 810 of voltages and currents as a function of time during turn-off for the cascode circuit 700 implemented with the cell 100. During the switching off event, as the drain current $I_D$ drops to zero, the switching voltage $V_{SW}$ increases and experiences voltage overshoot 812. FIG. 8B indicates that the cell 100 will effectively cause the voltage overshoot 812 to decay within about 0.05 μs. Overshoot in the off-current is damped within about the same time interval.

Figure 9A:
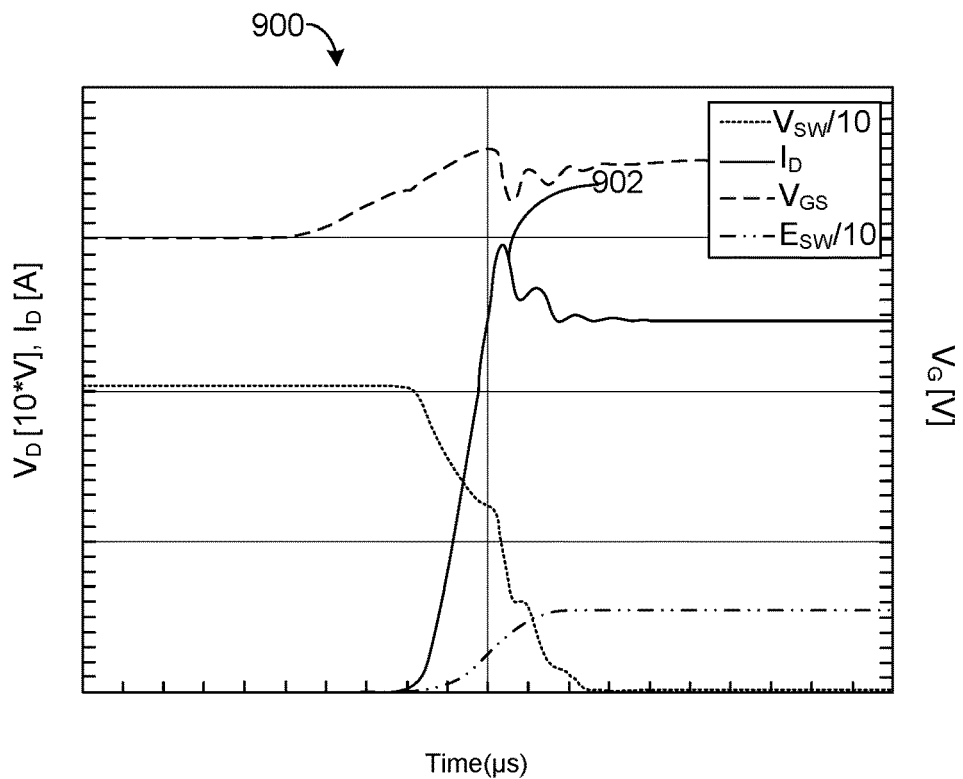
FIG. 9A is a plot showing the simulated behavior of a second switching cell during a turn-on event, according to implementations of the present disclosure.
Figure 9B:
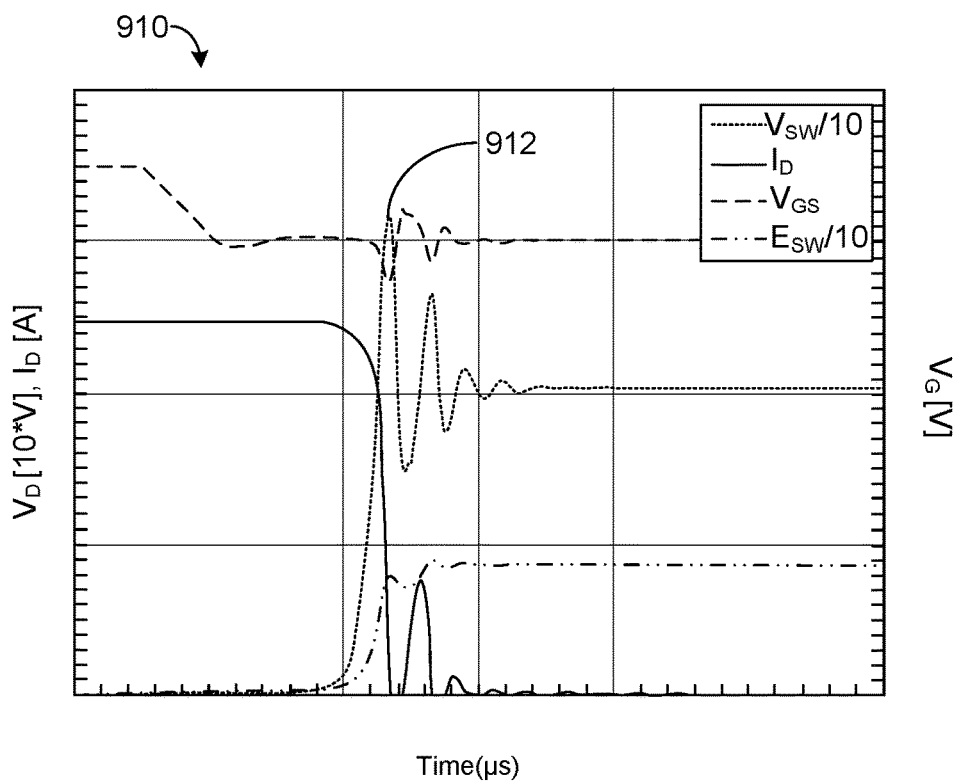
FIG. 9B is plot showing the simulated behavior of a second switching cell during a turn-off event, according to implementations of the present disclosure.

FIGS. 9A and 9B show simulation results of the cascode circuit described above with reference to FIG. 7 and FIG. 2, in accordance with some implementations of the present disclosure. In FIGS. 9A and 9B, the low voltage MOSFET chip 704 of the high power cascode circuit 700 is implemented with the cell 200. That is, the low voltage MOSFET chip 704 includes the fast transistor 204 and the slow transistor 202 in parallel, wherein the fast device dominates turn-on, and the slow device dominates turn-off. FIG. 9A shows a plot 900 of voltages and currents as a function of time in microseconds during turn-on for the high power cascode circuit implemented with the cell 200. In the simulation, the drain current was set to 50 A. During the switching on event, as the switching voltage $V_{SW}$ decreases, the drain current $I_D$ abruptly turns on and experiences current overshoot 902. FIG. 9A indicates that the cell 200 will effectively damp the overshoot 902 within about 0.01 μs.

FIG. 9B shows a plot 910 of voltages and currents as a function of time in microseconds during turn-off for the cascode circuit 700 implemented with the cell 200. During the switching off event, as the drain current $I_D$ drops to zero, the switching voltage $V_{SW}$ increases and experiences voltage overshoot 912. FIG. 9B indicates that the cell 200 will effectively cause the voltage overshoot 912 to decay within about 0.06 μs. Overshoot in the off-current is damped within about the same time interval.

Figure 10:
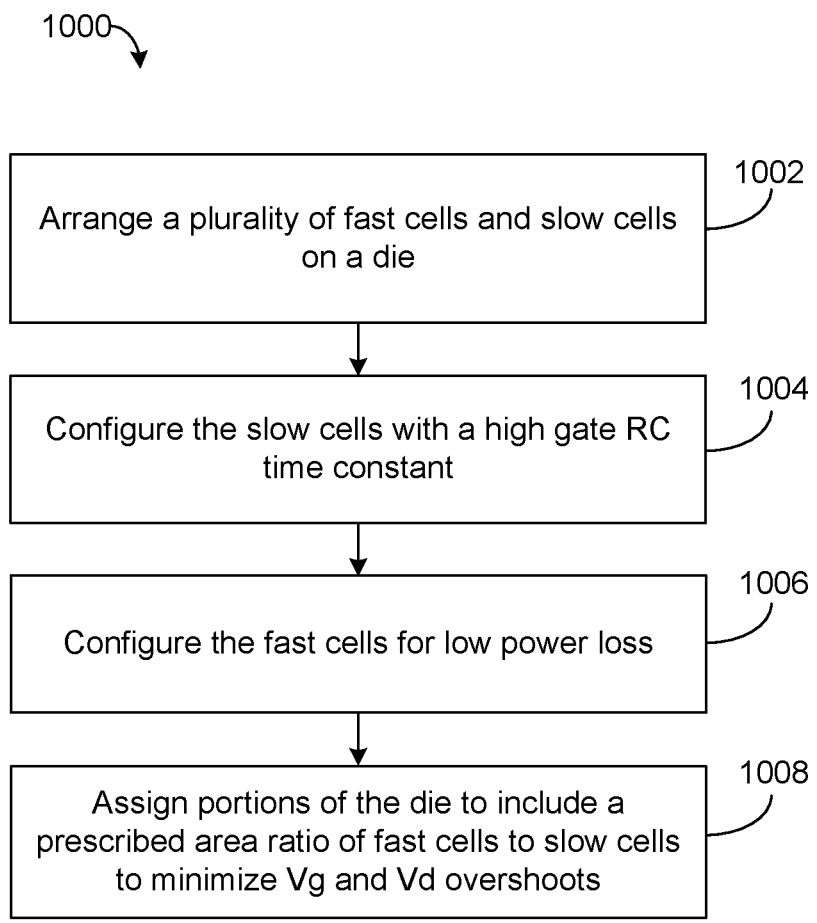
FIG. 10 is a flow diagram illustrating a method of configuring a die with fast and slow cells to suppress voltage oscillations, according to an implementations of the present disclosure.

FIG. 10 is a flow chart illustrating a method 1000 for configuring a die, e.g., the die 300, with fast cells and slow cells to reduce voltage overshoot, in accordance with some implementations of the present disclosure. Operations 1002-1008 of the method 1000 can be carried out to configure the die 300, according to some implementations as described above with reference to FIGS. 1-6. Operations of the method 1000 can be performed in a different order, or not performed, depending on specific applications. It is noted that the method 1000 may not completely configure the die 300 as desired. Accordingly, it is understood that additional processes can be provided before, during, or after method 1000, and that some of these additional processes may be briefly described herein.

At 1002, the method 1000 includes arranging a plurality of fast cells and slow cells on the die 300. A single semiconductor die 300 for use in a high power application can be configured with various arrangements of fast cells and slow cells. In some implementations, slow cells can be disposed among the fast cells. For example, the fast cells and slow cells can be interspersed as shown in FIG. 4 by interdigitating a number of the slow cell gate structures 402 with the fast cell gate structures 404. In some implementations, the die can be partitioned. For example, fast cells and slow cells can each be arranged in blocks so that the slow cells are isolated in a certain area of the die, separate from an area where fast cells are concentrated.

At 1004, the method 1000 includes configuring the slow cells with a high gate RC time constant. Increasing the gate RC time constant can be accomplished by increasing the gate resistance $r_G$ or $R_G$, or by increasing the gate-drain capacitance $C_{GD}$ via a shield-to-gate connection. In some implementations, both the gate resistance and the gate-drain capacitance can be increased to slow the rate of switching. Meanwhile, the speed of the fast cells need not be adjusted down since the fast cells can be configured separately and controlled separately from the slow cells.

At 1006, the method 1000 includes configuring the fast cells for low power loss. The speed of fast cells can be increased, e.g., by adjusting the gate resistance. During a switching event, the current will then decrease quickly enough so that there is little to no overlap between a high current value and a high voltage value, which will limit power dissipation in the form of $I^2R$ loss.

At 1008, the method 1000 includes assigning portions of the die 300 to include a prescribed area ratio of fast cells to slow cells. The area ratio can be defined as a ratio of the die area containing fast cells to the die area containing slow cells. The area ratio can be configured as needed in different portions of the die 300 to balance a high switching speed with low power loss during switching events within each die. In some implementations, changing the area ratio can achieve a targeted capacitance. In some implementations, the ratio of fast cells to slow cells can be equal, e.g., 50/50, or a 1:1 ratio. In some implementations, the ratio can be closer to 10:1 so that the percentage of slow cells can be about 10% to about 15%. In some implementations, the fast cells can be sized differently than the slow cells. For example, the fast cells can be larger than the slow cells by about 10% to about 50%. In some implementations, the size of the fast cells can be about 25% greater than the slow cells.

Figure 11:
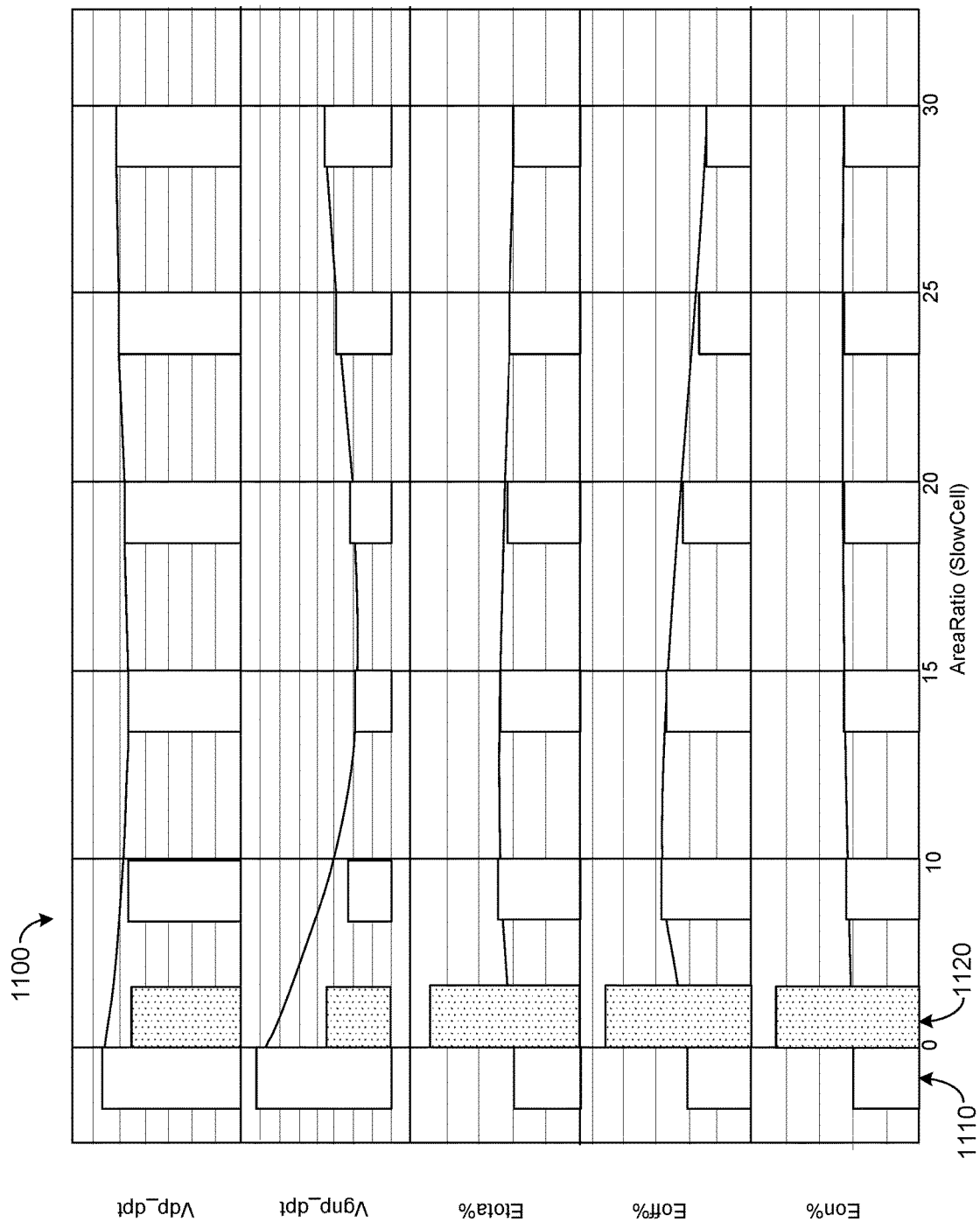
FIG. 11 is a series of bar charts showing the simulated behavior of switching cells as a function of area ratio, according to implementations of the present disclosure.

FIG. 11 is a series of simulated bar charts 1100 showing peak drain and gate voltage spikes and power loss, or energy loss E, as a function of the area ratio of slow cells, in accordance with some implementations of the present disclosure. The area ratio on the horizontal axis represents the percentage of slow cells incorporated within the die, e.g., the die 300, ranging from 0% to 30%. Thus, the bulk of the active area 302 contains lower gate RC time constant cells that turn on and off first to minimize power loss, while the slow cells with a larger gate RC time constant experience delayed switching to reduce voltage overshoot.

The bottom three bar charts show calculated energy losses during turn-on, turn-off, and total energy loss as a function of the slow cell percentage. The top two bar charts show simulated peak gate voltage overshoot $V_g$ and drain voltage overshoot $V_d$ as a function of slow cell area. The leftmost bar 1110 corresponds to 0% slow cells (that is, all fast cells), and the adjacent bar 1010 corresponds to 100% slow cells (that is, no fast cells). These two extreme cases represent a single cell die for comparison against a die that incorporates a mixture of fast and slow cells.

Comparing the bars 1110 with the bars 1120, it is apparent that, without any slow cells, e.g., for the bars 1110, neither the gate voltage overshoot nor the drain voltage overshoot is suppressed, so both voltages are at their maximum values. The energy loss is normalized to 100 for 0% slow cells. With 100% slow cells, e.g., for the bars 1120, the gate voltage overshoot has decreased by about 50% and the drain voltage overshoot experiences maximum suppression, about a 22% drop. Meanwhile, for 100% slow cells, the energy loss increases by about 24%. This represents a least favorable (e.g., less desirable) switching loss scenario.

The optimal (e.g., desirable) scenario occurs for 15% slow cells, where the gate voltage overshoot experiences maximum suppression of 77% and the drain voltage overshoot is down by about 19%, while the power loss has only increased a small amount, by about 4%. Thus, compared with a single cell die, a die having a mixture of about 15% slow cells and 85% fast cells can suppress $V_g$ and $V_d$ overshoot more effectively with less power loss.

FIG. 11 further illustrates that there is an asymmetric effect at turn-on vs. at turn-off. While the power loss at turn-on is flat as a function of area ratio, FIG. 11 shows that as the ratio of slow cells increases, the energy loss during turn-off keeps improving. That is, FIG. 10 shows the benefit of the fast devices at turn-on and the benefit of the slow devices at turn-off.

FIGS. 12A, 12B, and 12C show voltages and currents as a function of time in microseconds during a turn-off event, in accordance with some implementations of the present disclosure. FIG. 12A corresponds to the leftmost bar 1110 in FIG. 11, where a single cell die includes only fast cells (0% slow cells). FIG. 12B corresponds to the adjacent bar 1120 in FIG. 11, where the single cell die includes only slow cells (100% slow cells). FIG. 12C corresponds to the best case scenario in FIG. 11, where the die 300 combines both fast and slow cells (e.g., about 15% slow cells). FIG. 12A shows that, during turn-off, as the drain current $I_D$ decreases and the drain voltage increases, both the gate voltage experiences large negative voltage overshoot and the drain voltage experiences large positive voltage overshoot. The large negative spike in the gate voltage is particularly undesirable because it could potentially damage the gate oxide of the transistor. In FIG. 12B, with 100% slow cells, the voltage spike and the oscillations are suppressed. In FIG. 12C, with 15% slow cells, the overshoots in $V_G$ and $V_D$ are mostly suppressed and both voltages exhibit only a small ripple that damps quickly so that the gate voltage remains above negative 30 V and the drain voltage stays well under 500 V. A comparison of FIG. 12B and FIG. 12C shows that having 15% slow cells is almost as beneficial as having 100% slow cells.

As described above, various implementations of switching cells suitable for use in high power applications can suppress voltage spikes and oscillations, while limiting power losses during a switching event. Trade-offs between power loss and damping the gate voltage and drain voltage signals can be negotiated by adjusting a ratio of slow cells to fast cells within the same die. Placement of cells within the die, and gate resistance values are additional variables that can be adjusted to balance the need for voltage spike suppression against the desire for power conservation.

It will be understood that, in the foregoing description, when an element, such as a layer, a region, or a substrate, is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application may be amended to recite exemplary relationships described in the specification or shown in the figures.

As used in this specification, a singular form may, unless definitely indicating a particular case in terms of the context, include a plural form. Spatially relative terms (e.g., over, above, upper, under, beneath, below, lower, top, bottom, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor device processing techniques associated with semiconductor substrates including, but not limited to, for example, silicon (Si), silicon carbide (SiC), gallium arsenide (GaAs), gallium nitride (GaN), and/or so forth.

While certain features of the described implementations have been illustrated as described herein, many modifications, substitutions, changes, and equivalents will now occur to those skilled in the art. For instance, features illustrated with respect to one implementation can, where appropriate, also be included in other implementations. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. An apparatus, comprising:
a first multi-terminal device having a first source, a first shield, a first gate, and a first drain;
a second multi-terminal device having a second source, a second shield, a second gate, and a second drain, wherein:
the first drain is coupled to the second drain;
the first gate is coupled to the second gate; and
the first source is coupled to the second source; and
a gate resistor coupled between the first gate and the second gate, the gate resistor configured to reduce voltage overshoot during a switching event, wherein the second shield is electrically coupled to the second gate.

2. The apparatus of claim 1, wherein the first shield is coupled to the first source.

3. The apparatus of claim 1, wherein a value of the gate resistor is in a range of about 4 to about 20 Ohms.

4. The apparatus of claim 1, wherein a value of the gate resistor is in a range of about 50 to about 400 Ohms.

5. The apparatus of claim 1, wherein the gate resistor is a first gate resistor, and wherein the first gate is coupled to a common gate terminal through the first gate resistor having a first resistance and the second gate is coupled to the common gate terminal through a second gate resistor having a second resistance greater than the first resistance.

6. A circuit, comprising:
a plurality of first cells, each first cell comprising a first transistor having a first source, a first gate, and a first drain, the first transistor further configured with a first shield terminal coupled to the first source;
a plurality of second cells, each second cell comprising a second transistor having a second source, a second gate, and a second drain, the second transistor further configured with a second shield terminal;
a first gate bus coupled to the plurality of first cells, the first gate bus coupled to a common gate terminal through a first resistor; and
a second gate bus coupled to the plurality of second cells, the second gate bus coupled to the common gate terminal through a second resistor.

7. The circuit of claim 6, wherein the second shield terminal is electrically coupled to the second gate.

8. The circuit of claim 6, wherein the second shield terminal is coupled to the second source.

9. The circuit of claim 6, wherein a ratio of the plurality of first cells to the plurality of second cells is about 1:1.

10. The circuit of claim 6, wherein a ratio of the plurality of first cells to the plurality of second cells is about 10:1.

11. The circuit of claim 6, wherein an active area of the plurality of first cells is about 10% to about 25% larger than an active area of the plurality of second cells.

12. The circuit of claim 6, wherein the circuit is partitioned into a first block including the plurality of first cells and a second block including the plurality of second cells.

13. The circuit of claim 6, wherein the plurality of first cells is configured to switch faster than the plurality of second cells, with a lower power loss.

14. The circuit of claim 6, wherein the plurality of first cells is interdigitated with the plurality of second cells.

15. The circuit of claim 6, wherein the plurality of second cells has a higher gate RC time constant than the plurality of first cells.

16. The circuit of claim 6, wherein the first gate bus is a metal gate bus, and wherein the second gate bus is a polysilicon gate bus.

17. The circuit of claim 6, wherein a resistance of the first resistor is lower than a resistance of the second resistor.

18. A method, comprising:
forming a plurality of first transistors and a plurality of second transistors in a die;
configuring the plurality of first transistors to have lower power loss than the plurality of second transistors; and
configuring the plurality of second transistors to have a greater gate RC time constant than the plurality of first transistors, including coupling respective gates of the plurality of second transistors to a common shield terminal.

19. The method of claim 18, wherein the die includes an area of the plurality of first transistors being greater than an area of the plurality of second transistors, to achieve a targeted capacitance.

20. The method of claim 18, wherein respective gates of the plurality of first transistors are coupled to a common gate terminal through a first resistor having a first resistance, and wherein respective gates of the plurality of second transistors are coupled to the common gate terminal through a second resistor having a second resistance greater than the first resistance.

* * * * *